United States Patent
Um et al.

(10) Patent No.: US 12,150,350 B2
(45) Date of Patent: Nov. 19, 2024

(54) DISPLAY DEVICE WITH INTERSECTING DATA LINES ADJACENT HOLE REGION AND ELECTRONIC DEVICE INCLUDING THE SAME

(71) Applicant: Samsung Display Co., LTD., Yongin-si (KR)

(72) Inventors: Nuree Um, Hwaseong-si (KR); Wonkyu Kwak, Seongnam-si (KR); Kyung-Hoon Kim, Uiwang-si (KR); Mihae Kim, Asan-si (KR); Jaewon Kim, Cheongju-si (KR); Hyungjun Park, Seongnam-si (KR); Changsoo Pyon, Seongnam-si (KR); Kyonghwan Oh, Seoul (KR); Junwon Choi, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 558 days.

(21) Appl. No.: 17/234,180

(22) Filed: Apr. 19, 2021

(65) Prior Publication Data
US 2021/0335988 A1 Oct. 28, 2021

(30) Foreign Application Priority Data
Apr. 23, 2020 (KR) .......................... 10-2020-0049222

(51) Int. Cl.
*H10K 59/131* (2023.01)
*H10K 77/10* (2023.01)

(52) U.S. Cl.
CPC ........... *H10K 59/131* (2023.02); *H10K 77/10* (2023.02)

(58) Field of Classification Search
CPC ............................. H10K 59/131; H10K 77/10
See application file for complete search history.

(56) References Cited

U.S. PATENT DOCUMENTS 11,067,864 B2 * 7/2021 Yoshida ............ G02F 1/136286
11,430,858 B2    8/2022 Song et al.
(Continued)

FOREIGN PATENT DOCUMENTS

KR    10-2017-0114026    10/2017
KR    10-2020-0021029     2/2020

OTHER PUBLICATIONS

Extended European search report for European Patent Application or Patent No. 21169341.1 dated Sep. 22, 2021.
(Continued)

*Primary Examiner* — Lex H Malsawma
(74) *Attorney, Agent, or Firm* — KILE PARK REED & HOUTTEMAN PLLC (57) ABSTRACT

A display device includes a substrate including a display region, a hole, and a hole edge region surrounding the hole, first data lines disposed on the substrate, extending in a first direction, arranged in a second direction intersecting the first direction in the display region, and bypassing the hole along the hole edge region, and second data lines disposed on the substrate, extending in the first direction, alternately arranged with the first data lines in the second direction in the display region, and bypassing the hole along the hole edge region. At least one of the first data lines intersects at least one of the second data lines such that the first data lines are disposed adjacent to each other and the second data lines are disposed adjacent to each other in the hole edge region.

18 Claims, 8 Drawing Sheets

(56) References Cited

U.S. PATENT DOCUMENTS

| | | | |
|---|---|---|---|
| 2008/0117497 A1* | 5/2008 | Shimodaira | G02F 1/1345 |
| | | | 361/748 |
| 2017/0154566 A1 | 6/2017 | Ryoo et al. | |
| 2018/0076416 A1 | 3/2018 | Cho et al. | |
| 2019/0051670 A1* | 2/2019 | Bei | H01L 27/124 |
| 2019/0123066 A1 | 4/2019 | Zhan et al. | |
| 2020/0044006 A1 | 2/2020 | Lee et al. | |
| 2020/0176657 A1* | 6/2020 | Jang | G06F 1/1626 |
| 2020/0403057 A1* | 12/2020 | Kang | G09G 3/3225 |
| 2021/0091160 A1* | 3/2021 | Lee | H10K 59/40 |

OTHER PUBLICATIONS

Korean Office Action with English translation for Korean Patent Application No. 10-2020-0049222, dated Sep. 30, 2024.

\* cited by examiner

DISPLAY DEVICE WITH INTERSECTING DATA LINES ADJACENT HOLE REGION AND ELECTRONIC DEVICE INCLUDING THE SAME

CROSS-REFERENCE TO RELATED APPLICATION(S)

This U.S. non-provisional patent application claims priority to and the benefit of Korean Patent Application No. 10-2020-0049222 under 35 USC § 119, filed in the Korean Intellectual Property Office (KIPO) on Apr. 23, 2020, the entire disclosure of which is incorporated herein by reference.

BACKGROUND

1. Technical Field

The disclosure relates to a display device. More specifically, the disclosure relates to a display device in which a hole is formed in a display area.

2. Description of the Related Art

A display device may include a display region for displaying an image and a non-display region located outside the display region. Pixels for displaying an image and wires connected to the pixels may be disposed in the display region. Drivers for driving the pixels and a functional module such as a camera module and a sensor module may be disposed in the non-display region.

In order to reduce a dead space caused by the non-display region, a hole may be formed in the display region. The functional module may be disposed on a rear surface of the display device to correspond to the hole, and the functional module may detect or recognize an object, a user, or the like located over a front surface of the display device through the hole. In case that the hole is formed in the display region, the wires disposed in the display region may bypass the hole. Accordingly, a hole edge region surrounding the hole, in which the wires are adjacent to each other so that the image is not displayed, may be formed at an edge of the hole.

SUMMARY

The disclosure provides a display device in which a coupling between wires in a hole edge region that surrounds a hole is prevented.

A display device according to an embodiment may include a substrate including a display region, a hole, and a hole edge region surrounding the hole, a plurality of first data lines disposed on the substrate, extending in a first direction, arranged in a second direction intersecting the first direction in the display region, and bypassing the hole along the hole edge region, and a plurality of second data lines disposed on the substrate, extending in the first direction, alternately arranged with the plurality of first data lines in the second direction in the display region, and bypassing the hole along the hole edge region. At least one of the plurality of first data lines may intersect at least one of the plurality of second data lines such that the plurality of first data lines are disposed adjacent to each other and the plurality of second data lines are disposed adjacent to each other in the hole edge region.

In an embodiment, in the hole edge region, the plurality of first data lines may overlap each other in a plan view, and the plurality of second data lines may overlap each other in a plan view.

In an embodiment, in the hole edge region, the plurality of first data lines may be adjacent to each other in a plan view, and the plurality of second data lines may be adjacent to each other in a plan view.

In an embodiment, each of the plurality of first data lines and the plurality of second data lines may include two data lines, and a first data line disposed between the plurality of second data lines among the plurality of first data lines may intersect a second data line disposed between the plurality of first data lines among the plurality of second data lines.

In an embodiment, in a region where the first data line intersects the second data line, the second data line may extend in a third direction different from the first direction and the second direction, and the first data line may extend in a fourth direction intersecting the third direction.

In an embodiment, in a region where the first data line intersects the second data line, the second data line may extend in a third direction different from the first direction and the second direction, and the first data line may extend in the first direction.

In an embodiment, the display device may further include a semiconductor layer disposed in the display region on the substrate, a gate electrode disposed over the semiconductor layer, a capacitor electrode disposed over the gate electrode, a source electrode and a drain electrode disposed over the capacitor electrode and electrically connected to the semiconductor layer, a connection electrode disposed over the source and drain electrodes and electrically connected to the source and drain electrodes, and a light emitting element disposed over the connection electrode and electrically connected to the connection electrode.

In an embodiment, in the hole edge region, the plurality of first data lines, the plurality of second data lines, and at least one of the gate electrode, the capacitor electrode, the source and drain electrodes, and the connection electrode may be disposed on a same layer.

In an embodiment, the display device may further include an emission control line disposed on the substrate, extending in the second direction in the display region, and bypassing the hole along the hole edge region.

In an embodiment, the plurality of first data lines, the plurality of second data lines, and at least one of the gate electrode and the capacitor electrode may be disposed on a same layer in the hole edge region, and the emission control line and the connection electrode in the hole edge region may be disposed on a same layer.

In an embodiment, the hole may have a circular shape, and the hole edge region may have a circular ring shape.

A display device according to an embodiment may include a substrate including a display region, a hole, and a hole edge region surrounding the hole, and a first wire, a second wire, a third wire, and a fourth wire each disposed on the substrate, extending in a first direction, arranged in a second direction intersecting the first direction in the display region, and bypassing the hole along the hole edge region. The second wire may intersect the third wire such that the first and third wires may be disposed adjacent to each other and the second and fourth wires may be disposed adjacent to each other in the hole edge region.

In an embodiment, in the hole edge region, the first and third wires may overlap each other in a plan view, and the second and fourth wires may overlap each other in a plan view.

In an embodiment, in the hole edge region, the first and third wires may be adjacent to each other in a plan view, and the second and fourth wires may be adjacent to each other in a plan view.

In an embodiment, in a region where the second wire intersects the third wire, the second wire may extend in a third direction different from the first direction and the second direction, and the third wire may extend in a fourth direction intersecting the third direction.

In an embodiment, the first direction may be orthogonal to the second direction, and the fourth direction may be orthogonal to the third direction.

In an embodiment, in a region where the second wire intersects the third wire, the second wire may extend in a third direction different from the first direction and the second direction, and the third wire may extend in the first direction.

In an embodiment, the first and third wires may be electrically connected to first pixels disposed in the display region on the substrate, and the second and fourth wires may be electrically connected to second pixels disposed in the display region on the substrate to display a color different from a color of the first pixels.

An electronic device according to an embodiment may include a display device including a display region, a hole, and a hole edge region surrounding the hole, and a functional module disposed under the display device and overlapping the hole. The display device may include a plurality of first data lines extending in a first direction, arranged in a second direction intersecting the first direction in the display region, and bypassing the hole along the hole edge region, and a plurality of second data lines extending in the first direction, alternately arranged with the plurality of first data lines in the second direction in the display region, and bypassing the hole along the hole edge region. At least one of the plurality of first data lines may intersect at least one of the plurality of second data lines such that the plurality of first data lines may be disposed adjacent to each other and the plurality of second data lines may be disposed adjacent to each other in the hole edge region.

In an embodiment, the functional module may include at least one of a camera module, a face recognition sensor module, a pupil recognition sensor module, an acceleration sensor module, a proximity sensor module, an infrared sensor module, and an illuminance sensor module.

In the display device according to the embodiments, at least one of the first data lines may intersect at least one of the second data lines such that the first data lines may be disposed adjacent to each other and the second data lines may be disposed adjacent to each other in the hole edge region, so that a distance between the first data lines and the second data lines may increase. Accordingly, a coupling between the first data lines and the second data lines may be reduced or substantially prevented.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Since the disclosure may have diverse modified embodiments, preferred embodiments are illustrated in the drawings and are described in the detailed description of the disclosure. However, this does not limit the disclosure within specific embodiments, and it should be understood that the disclosure covers all the modifications, equivalents, and replacements within the idea and technical scope of the disclosure.

In this specification, it will also be understood that when one component (or region, layer, portion) is referred to as being "on," "connected to," or "coupled to" another component, it can be directly disposed on, or connected or coupled to the one component, or an intervening third component may also be present.

In this application, it will be understood that when a layer, a film, a region, or a plate "directly contacts" another layer, film, region, or plate, there is no another layer, film, region, or plate present therebetween. For example, if a layer is "directly disposed" on another layer, the layer may be disposed on the another layer without using an additional member such as an adhesive member.

Like reference numerals refer to like elements throughout. Also, in the figures, the thickness, ratio, and dimensions of components may be exaggerated for clarity of illustration.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The terms "under," "below," "above," "upper," "surround," "adjacent," and the like are used for explaining relation association of components illustrated in the drawings. The terms may be a relative concept and described based on directions illustrated in the drawings. It will also be understood that when an element or layer is referred to as being "on" another one, it can be disposed on the upper portion or the lower portion of another one.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, display devices and electronic devices in accordance with embodiments will be explained in detail with reference to the accompanying drawings.

Hereinafter, a display device according to an embodiment will be described with reference to FIGS. 1 to 5.

Figure 1:
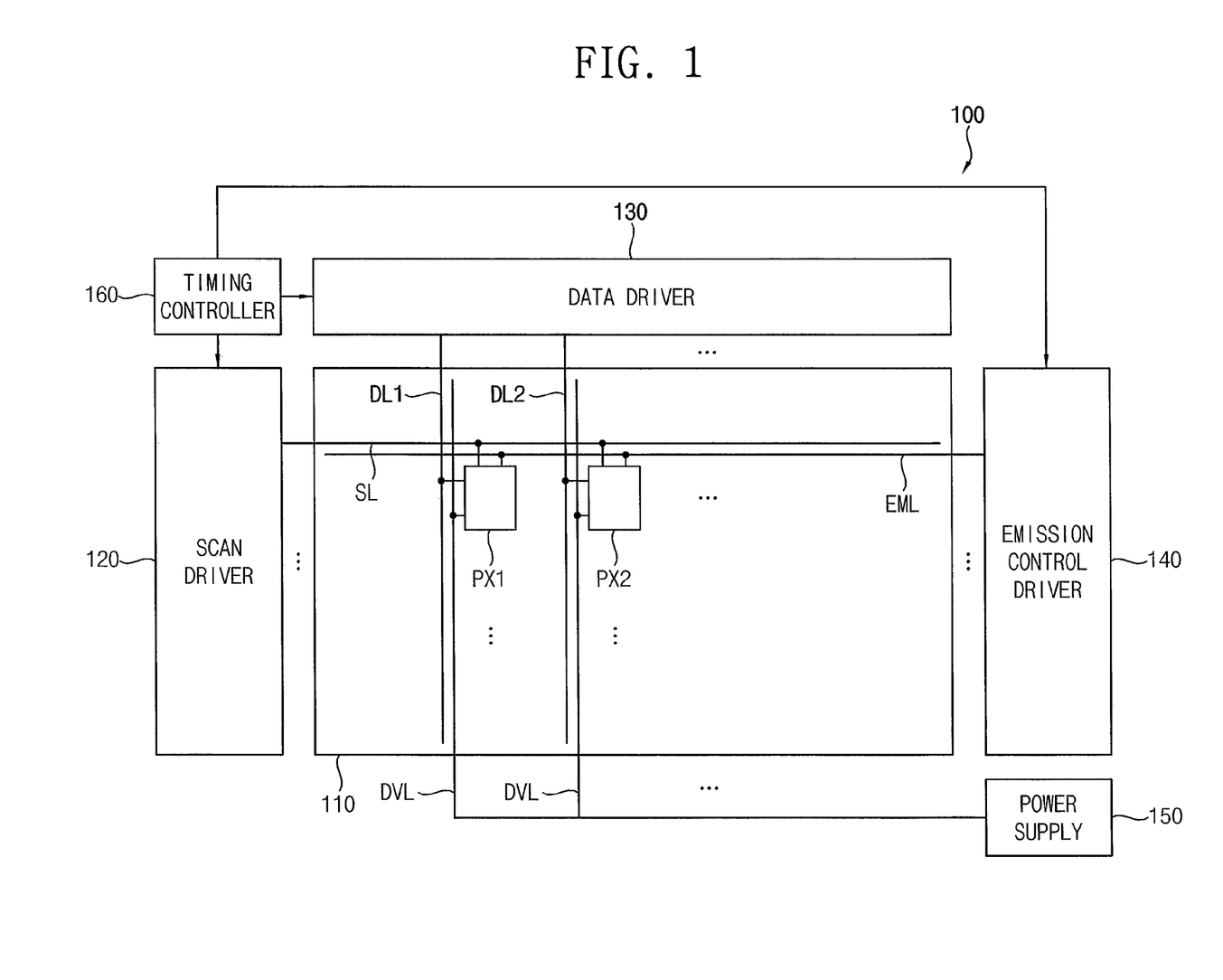
FIG. 1 is a schematic block diagram illustrating a display device according to an embodiment.

FIG. 1 is a schematic block diagram illustrating a display device according to an embodiment.

Referring to FIG. 1, according to an embodiment, a display device may include a display unit 110, a scan driver 120, a data driver 130, an emission control driver 140, a power supply 150, and a timing controller 160.

The display unit 110 may be located at an intersecting portion of scan lines SL, a data lines DL1 and DL2, emission control lines EML, and driving voltage lines DVL, and may include pixels PX1 and PX2 arranged substantially in a matrix form. The scan lines SL and the emission control lines EML may generally extend in a row direction, and the data lines DL1 and DL2 and the driving voltage lines DVL may generally extend in a column direction.

The pixels PX1 and PX2 may be electrically connected to the scan lines SL, the data lines DL1 and DL2, the emission control lines EML, and the driving voltage lines DVL. The pixels PX1 and PX2 may include first pixels PX1 and second pixels PX2. The second pixels PX2 may display a color different from a color of the first pixels PX1. In an embodiment, the first pixels PX1 may display a red or blue color, and the second pixels PX2 may display a green color.

The scan driver 120 may be electrically connected to the scan lines SL. The scan driver 120 may transmit scan signals to the pixels PX1 and PX2 through the scan lines SL.

The data driver 130 may be electrically connected to the data lines DL1 and DL2. The data lines DL1 and DL2 may include first data lines DL1 and second data lines DL2. The first data lines DL1 may be electrically connected to the first pixels PX1, and the second data lines DL2 may be electrically connected to the second pixels PX2. The data driver 130 may transmit data signals to the pixels PX1 and PX2 through the data lines DL1 and DL2. The data signals may be supplied to the pixels PX1 and PX2 selected by the scan signals in case that the scan signals are supplied through the scan lines SL.

The emission control driver 140 may be electrically connected to the emission control lines EML. The emission control driver 140 may transmit emission control signals to the pixels PX1 and PX2 through the emission control lines EML. The emission control signals may control emission times of the pixels PX1 and PX2.

The pixels PX1 and PX2 may receive a driving voltage and a common voltage from the power supply 150. The driving voltage may be a predetermined high-level voltage, and the common voltage may be a voltage lower than the driving voltage or a ground voltage. The power supply 150 may be electrically connected to the driving voltage lines DVL. The power supply 150 may transmit the driving voltage to the pixels PX1 and PX2 through the driving voltage lines DVL.

The timing controller 160 may convert image signals transmitted from an outside source into image data signals and may transmit the image data signals to the data driver 130. The timing controller 160 may receive a vertical synchronization signal, a horizontal synchronization signal, and a clock signal to generate control signals for controlling driving of the scan driver 120, the data driver 130, and the emission control driver 140 and may transmit the generated control signals to the scan driver 120, the data driver 130, and the emission control driver 140.

The pixels PX1 and PX2 may emit light having a predetermined luminance in response to a driving current supplied to the light emitting element according to the data signals transmitted through the data lines DL1 and DL2. For the sake of convenience, a display device including an organic light emitting diode (OLED) as the light emitting element will be described below, but the embodiments are not limited thereto. The disclosure may be applied to various types of display devices such as a liquid crystal display device, an electrophoretic display device, and a light emitting diode (LED) display device.

Figure 2:
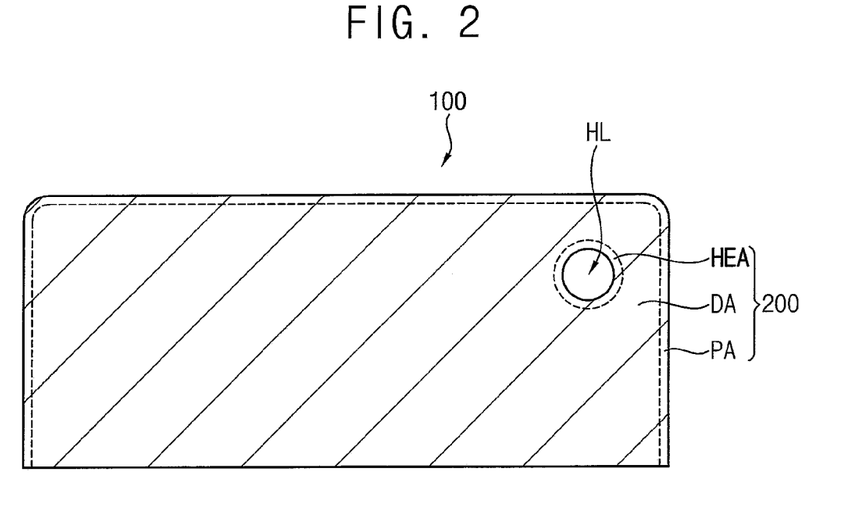
FIG. 2 is a schematic plan view illustrating a part of the display device according to an embodiment.

FIG. 2 is a schematic plan view illustrating a part of the display device according to an embodiment.

Referring to FIGS. 1 and 2, according to an embodiment, the display device may include a substrate 200 on which the pixels PX1 and PX2, the lines SL, DL1, DL2, EML, and DVL, the scan driver 120, the data driver 130, the emission control driver 140, the power supply 150, and the timing controller 160 are disposed. The substrate 200 may include a display region DA, a peripheral region PA, and a hole edge region HEA.

The pixels PX1 and PX2 and the lines SL, DL1, DL2, EML, and DVL may be disposed in the display region DA on the substrate 200. The display region DA may display an image through the light emitted from each of the pixels PX1 and PX2.

The peripheral region PA may surround the display region DA. The peripheral region PA may form (or constitute) a bezel of the display device. The scan driver 120 and the emission control driver 140 may be disposed in the peripheral region PA on the substrate 200. The data driver 130, the power supply 150, and the timing controller 160 may be disposed in the peripheral region PA on the substrate 200, or may be disposed on a printed circuit board, a flexible printed circuit, or the like electrically connected to the substrate 200. The peripheral region PA may be a non-display region.

A hole HL may be formed in the display region DA. The hole HL may be formed through the substrate 200. A functional module may be disposed under the substrate 200 to correspond to the hole HL. The functional module may receive external light passing through the hole HL or may transmit a signal such as infrared rays and ultrasonic waves.

In an embodiment, the functional module may include a camera module for capturing (or recognizing) an image of an object that is located over a front surface of the display device; a face recognition sensor module for detecting a face of a user; a pupil recognition sensor module for detecting a pupil of the user; an acceleration sensor module and a geomagnetic sensor module for determining a movement of the display device; a proximity sensor module and an infrared sensor module for detecting proximity with respect to the front surface of the display device; and an illuminance sensor module for measuring a degree of brightness of an outside.

The hole edge region HEA may surround the hole HL. The lines SL, DL1, DL2, EML, and DVL may be disposed in the hole edge region HEA on the substrate 200. The lines SL, DL1, DL2, EML, and DVL may bypass the hole HL along the hole edge region HEA. For example, the lines SL, DL1, DL2, EML, and DVL may be bent or curved according to a shape of the hole edge region HEA without passing through the hole HL. The pixels PX1 and PX2 may not be disposed in the hole edge region HEA on the substrate 200, so that the hole edge region HEA may be a non-display region.

In an embodiment, the hole HL may have a circular shape in a plan view, and the hole edge region HEA may have a circular ring shape in a plan view, but the embodiments are not limited thereto. In another embodiment, the hole HL may have a polygonal shape, an elliptical shape, or the like in a plan view. Although FIG. 2 shows that a hole HL is formed within the display region DA, the embodiments are not limited thereto, and holes may be formed in the display region DA.

Figure 3:
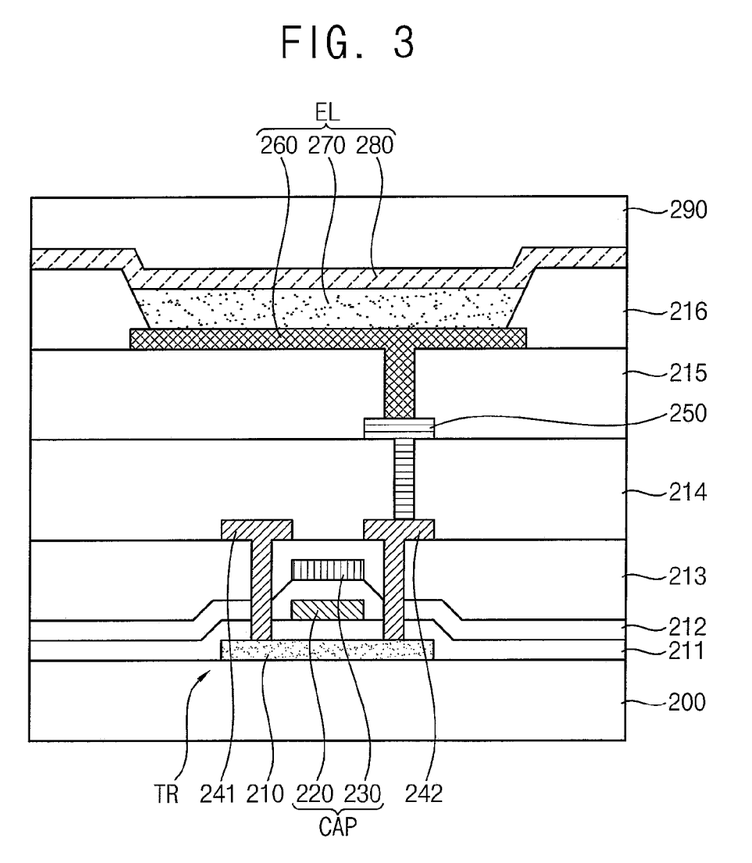
FIG. 3 is a schematic cross sectional view illustrating a display region of the display device of FIG. 2.

FIG. 3 is a schematic cross-sectional view illustrating a display region DA of the display device of FIG. 2. For example, FIG. 3 illustrates the first pixel PX1 or the second pixel PX2 of the display device of FIG. 1.

Referring to FIG. 3, the display device may include a transistor TR, a capacitor CAP, a light emitting element EL, and an encapsulation layer 290 that are disposed on the substrate 200.

The substrate 200 may be a transparent insulating substrate. For example, the substrate 200 may be formed of (or include) glass, quartz, plastic, or the like.

A semiconductor layer 210 may be disposed on the substrate 200. The semiconductor layer 210 may be formed of amorphous silicon, polycrystalline silicon, or an oxide semiconductor. The semiconductor layer 210 may include a source region, a drain region, and a channel region disposed between the source region and the drain region. The source region and the drain region may be doped with P-type or N-type impurities, and the channel region may be doped with impurities having a type different from that of the impurities of the source region and the drain region.

A first insulating layer 211 may be disposed on the semiconductor layer 210. The first insulating layer 211 may be formed on the substrate 200 to cover or overlap the semiconductor layer 210. The first insulating layer 211 may insulate a gate electrode 220 from the semiconductor layer 210. The first insulating layer 211 may be formed of an inorganic insulating material such as silicon nitride, silicon oxide, or silicon oxynitride.

The gate electrode 220 may be disposed on the first insulating layer 211. The gate electrode 220 may overlap the channel region of the semiconductor layer 210. The gate electrode 220 may be formed of a conductive material such as a metal or a metal alloy. For example, the gate electrode 220 may be formed of molybdenum (Mo), copper (Cu), or the like.

A second insulating layer 212 may be disposed on the gate electrode 220. The second insulating layer 212 may be formed on the first insulating layer 211 to cover or overlap the gate electrode 220. The second insulating layer 212 may insulate a capacitor electrode 230 from the gate electrode 220. The second insulating layer 212 may be formed of an inorganic insulating material such as silicon nitride, silicon oxide, or silicon oxynitride.

The capacitor electrode 230 may be disposed on the second insulating layer 212. The capacitor electrode 230 may overlap the gate electrode 220. The capacitor electrode 230 may be formed of a conductive material such as a metal or a metal alloy. For example, the capacitor electrode 230 may be formed of molybdenum (Mo), copper (Cu), or the like. The gate electrode 220 and the capacitor electrode 230 may form the capacitor CAP.

A third insulating layer 213 may be disposed on the capacitor electrode 230. The third insulating layer 213 may be formed on the second insulating layer 212 to overlap the capacitor electrode 230. The third insulating layer 213 may insulate source and drain electrodes 241 and 242 from the capacitor electrode 230. The third insulating layer 213 may be formed of an inorganic insulating material such as silicon nitride, silicon oxide, or silicon oxynitride.

The source and drain electrodes 241 and 242 may be disposed on the third insulating layer 213. The source and drain electrodes 241 and 242 may include a source electrode 241 and a drain electrode 242. The source electrode 241 may be electrically connected to the source region of the semiconductor layer 210, and the drain electrode 242 may be electrically connected to the drain region of the semiconductor layer 210. Each of the source and drain electrodes 241 and 242 may be formed of a conductive material such as a metal or a metal alloy. For example, each of the source and drain electrodes 241 and 242 may be formed of aluminum (Al), titanium (Ti), copper (Cu), or the like. The semiconductor layer 210, the gate electrode 220, the source electrode 241, and the drain electrode 242 may form the transistor TR.

A fourth insulating layer 214 may be disposed on the source and drain electrodes 241 and 242. The fourth insulating layer 214 may be formed on the third insulating layer 213 to overlap the source and drain electrodes 241 and 242. The fourth insulating layer 214 may protect the transistor TR, and may provide a flat surface to an upper portion of the transistor TR. Accordingly, the fourth insulating layer 214 may have a relatively large thickness. For example, the thickness of the fourth insulating layer 214 may be greater than a thickness of the first insulating layer 211, a thickness of the second insulating layer 212, and a thickness of the third insulating layer 213. The fourth insulating layer 214 may be formed of an organic insulating material such as polyimide (PI).

A connection electrode 250 may be disposed on the fourth insulating layer 214. The connection electrode 250 may be electrically connected to the source electrode 241 or the drain electrode 242. The connection electrode 250 may be formed of a conductive material such as a metal or a metal alloy. For example, the connection electrode 250 may be formed of aluminum (Al), titanium (Ti), copper (Cu), or the like.

A fifth insulating layer 215 may be disposed on the connection electrode 250. The fifth insulating layer 215 may be formed on the fourth insulating layer 214 to cover or overlap the connection electrode 250. The fifth insulating layer 215 may be formed of an organic insulating material such as polyimide (PI).

A first electrode 260 may be disposed on the fifth insulating layer 215. The first electrode 260 may be electrically connected to the connection electrode 250. The first electrode 260 may be formed of a conductive material such as a metal or transparent conductive oxide.

A sixth insulating layer 216 may be disposed on the first electrode 260. The sixth insulating layer 216 may include a pixel opening that exposes a central portion of the first electrode 260. The sixth insulating layer 216 may separate a second electrode 280 from an edge of the first electrode 260 to prevent an arc ore the like from occurring between the edge of the first electrode 260 and the second electrode 280. The sixth insulating layer 216 may be formed of an organic insulating material such as polyimide (PI).

A light emitting layer 270 may be disposed on the first electrode 260. The light emitting layer 270 may be disposed on the first electrode 260 exposed by the pixel opening. The light emitting layer 270 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, and the like, and the high molecular weight organic compound may include poly(3,4-ethylenedioxythiophene), polyaniline, poly-phenylenevinylene, polyfluorene, and the like.

In an embodiment, the quantum dot may include a core including a group II-VI compound, a group III-V compound, a group IV-VI compound, a group IV element, a group IV compound, or a combination thereof. In an embodiment, the quantum dot may have a core-shell structure including a core and a shell surrounding the core. The shell may serve as a protective layer for maintaining semiconductor characteristics by preventing chemical modification of the core and may serve as a charging layer for imparting electrophoretic characteristics to the quantum dot.

A second electrode 280 may be disposed on the light emitting layer 270. The second electrode 280 may also be disposed on the sixth insulating layer 216. The second electrode 280 may face the first electrode 260 with the light emitting layer 270 interposed therebetween. The second electrode 280 may be formed of a conductive material such as a metal or transparent conductive oxide. The first electrode 260, the light emitting layer 270, and the second electrode 280 may form or constitute the light emitting element EL. Since the first electrode 260 is electrically connected to the connection electrode 250, the light emitting element EL may be electrically connected to the connection electrode 250.

The encapsulation layer 290 may be disposed on the second electrode 280. The encapsulation layer 290 may include at least one inorganic layer and at least one organic layer. The encapsulation layer 290 may be disposed on the light emitting element EL to prevent external impurities from being introduced into the light emitting element EL and may protect the light emitting element EL from an external impact.

In an embodiment, the encapsulation layer 290 may include a first inorganic layer, a second inorganic layer disposed over the first inorganic layer, and an organic layer disposed between the first inorganic layer and the second inorganic layer. The first inorganic layer and the second inorganic layer may reduce or substantially block penetration of impurities such as oxygen and moisture into the light emitting element EL. The organic layer may improve sealing characteristics of the encapsulation layer 290, relieve internal stress of the first inorganic layer and the second inorganic layer, compensate for defects in the first inorganic layer and the second inorganic layer, and provide a flat top surface to the second inorganic layer.

Figure 4:
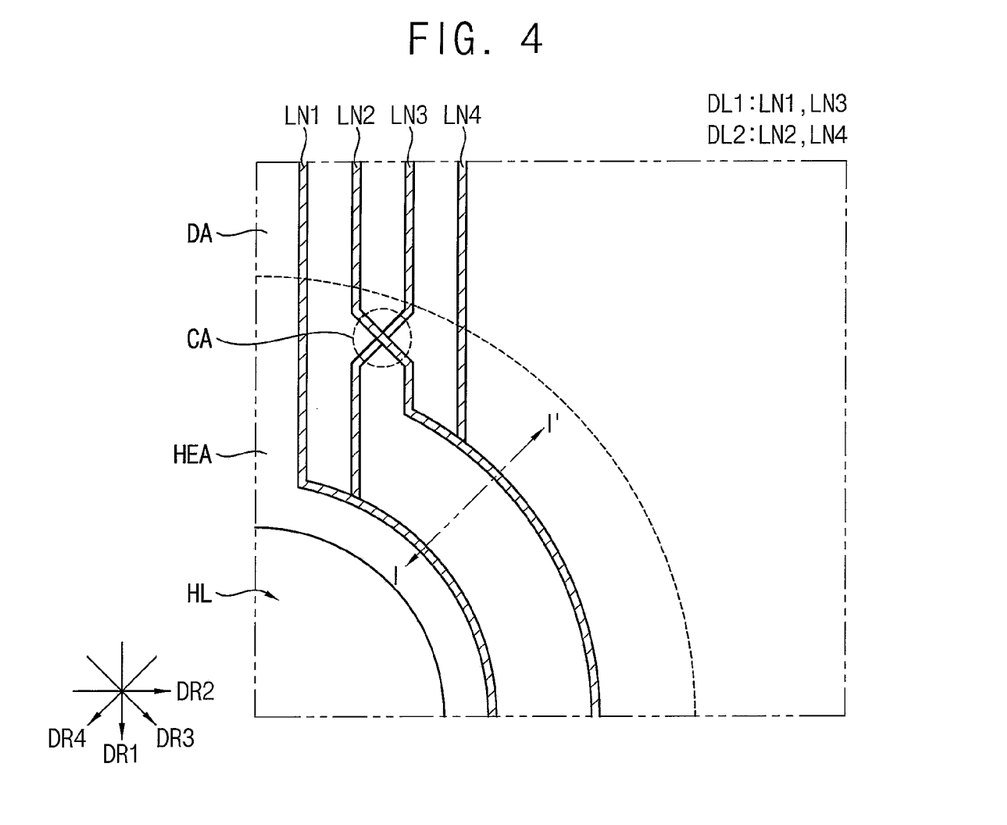
FIG. 4 is a schematic plan view illustrating an example of a periphery of a hole of the display device of FIG. 2.

FIG. 4 is a schematic plan view illustrating an example of a periphery of a hole HL of the display device of FIG. 2. FIG. 4 illustrates the first data lines DL1 and the second data lines DL2 of the display device of FIG. 1.

Referring to FIGS. 2, 3, and 4, the first data lines DL1 and the second data lines DL2 may be disposed in the display region DA and the hole edge region HEA on the substrate 200.

The first data lines DL1 may extend in a first direction DR1 in the display region DA and may be arranged in a second direction DR2 intersecting or orthogonal to the first direction DR1. The first data lines DL1 may bypass the hole HL along the hole edge region HEA.

The second data lines DL2 may extend in the first direction DR1 in the display region DA and may be alternately arranged with the first data lines DL1 in the second direction DR2. The second data lines DL2 may bypass the hole HL along the hole edge region HEA.

In an embodiment, the first data lines DL1 may include a first wire LN1 and a third wire LN3 arranged in the second direction DR2 in the display region DA, and the second data lines DL2 may include a second wire LN2 and a fourth wire LN4 arranged in the second direction DR2 in the display region DA. In this case, in the display region DA, the second wire LN2 may be located next to the first wire LN1 in the second direction DR2, the third wire LN3 may be located next to the second wire LN2 in the second direction, and the fourth wire LN4 may be located next to the third wire LN3 in the second direction. In other words, in the display region DA, the first to fourth wires LN1, LN2, LN3, and LN4 may be sequentially arranged in the second direction DR2.

In an embodiment, a first portion of each of the wires LN1, LN2, LN3, and LN4 disposed in the display region DA and a second portion of each of the wires LN1, LN2, LN3, and LN4 disposed in the hole edge region HEA may be electrically connected to each other by a contact part disposed at a boundary of the display region DA and the hole edge region HEA. For example, the first portion of each of the wires LN1, LN2, LN3, and LN4 and one of the gate electrode 220, the capacitor electrode 230, the source and drain electrodes 241 and 242, and the connection electrode 250 may be disposed on the same layer. The second portion of each of the wires LN1, LN2, LN3, and LN4 and another one of the gate electrode 220, the capacitor electrode 230, the source and drain electrodes 241 and 242, and the connection electrode 250 may be disposed on the same layer. The contact part and still another one of the gate electrode 220, the capacitor electrode 230, the source and drain electrodes 241 and 242, and the connection electrode 250 may be disposed on the same layer.

Since the hole edge region HEA is a non-display region, as an area of the hole edge region HEA decreases, a dead space of the display device may be reduced. In case that the area of the hole edge region HEA decreases, an interval (or distance) between the wires disposed in the hole edge region HEA may be reduced. However, in case that the first data lines DL1 and the second data lines DL2 are alternately arranged in the hole edge region HEA, an interval between the first data lines DL1 and the second data lines DL2 decreases, so that coupling between the first data lines DL1 and the second data lines DL2 may occur. In case that the coupling between the first data lines DL1 and the second data lines DL2 occurs, the data signal transmitted through the second data lines DL2 may be distorted by a voltage change of the data signal transmitted through the first data lines DL1, and the data signal transmitted through the first data lines DL1 may be distorted by a voltage change of the data signal transmitted through the second data lines DL2.

In order to prevent the coupling between the first data lines DL1 and the second data lines DL2 in the hole edge region HEA, at least one of the first data lines DL1 may intersect at least one of the second data lines DL2 such that the first data lines DL1 may be gathered with each other or adjacent to each other and the second data lines DL2 may be gathered with each other or adjacent to each other in the hole edge region HEA. In other words, in the hole edge region HEA, the first data lines DL1 may be collected with each other, and the second data lines DL2 may be collected with each other. For example, in the hole edge region HEA, the first and third wires LN1 and LN3 may be gathered with each other, and the second and fourth wires LN2 and LN4 may be gathered with each other.

In an embodiment, the first data lines DL1 and the second data lines DL2 may include two data lines, respectively, and a first data line disposed between the second data lines DL2 among the first data lines DL1 may intersect a second data line DL2 disposed between the first data lines DL1 among the second data lines DL2. In this case, the first data line may be the third wire LN3, and the second data line may be the second wire LN2. In other words, the third wire LN3 disposed between the second wire LN2 and the fourth wire LN4 may intersect the second wire LN2 disposed between the first wire LN1 and the third wire LN3.

In an embodiment, in a region CA where the second wire LN2 intersects the third wire LN3, the second wire LN2 may extend in a third direction DR3 different from the first direction DR1 and the second direction DR2, and the third wire LN3 may extend in a fourth direction DR4 intersecting the third direction DR3. For example, the third direction DR3 may form an acute angle with the first direction DR1 in a counterclockwise direction from the first direction DR1, and the fourth direction DR4 may form an acute angle with the first direction DR1 in a clockwise direction from the first direction DR1. In this case, the second wire LN2 extending in the first direction DR1 in the display region DA may be bent in the third direction DR3 in the region CA where the second wire LN2 intersects the third wire LN3, and the third wire LN3 extending in the first direction DR1 in the display region DA may be bent in the fourth direction DR4 in the region CA where the second wire LN2 intersects the third wire LN3. In an embodiment, the fourth direction DR4 may be substantially orthogonal to the third direction DR3.

In an embodiment, in the hole edge region HEA, the first data lines DL1 may overlap each other in a plan view, and the second data lines DL2 may overlap each other in a plan view. For example, in the hole edge region HEA, the third wire LN3 may overlap the first wire LN1 in a plan view, and the second wire LN2 may overlap the fourth wire LN4 in a plan view. Since the first data lines DL1 overlap each other in a plan view and the second data lines DL2 overlap each other in a plan view in the hole edge region HEA, the coupling between the first data lines DL1 and the second data lines DL2 may be reduced or substantially prevented. An area occupied by the first and second data lines DL1 and DL2 in the hole edge region HEA may be reduced, so that the area of the hole edge region HEA may be reduced.

In an embodiment, as shown in FIG. 4, in the hole edge region HEA, the first data lines DL1 may entirely overlap each other in a plan view, and the second data lines DL2 may entirely overlap each other in a plan view, but the embodiments are not limited thereto. In another embodiment, in the hole edge region HEA, the first data lines DL1 may partially overlap each other in a plan view, and the second data lines DL2 may partially overlap each other in a plan view.

Figure 5:
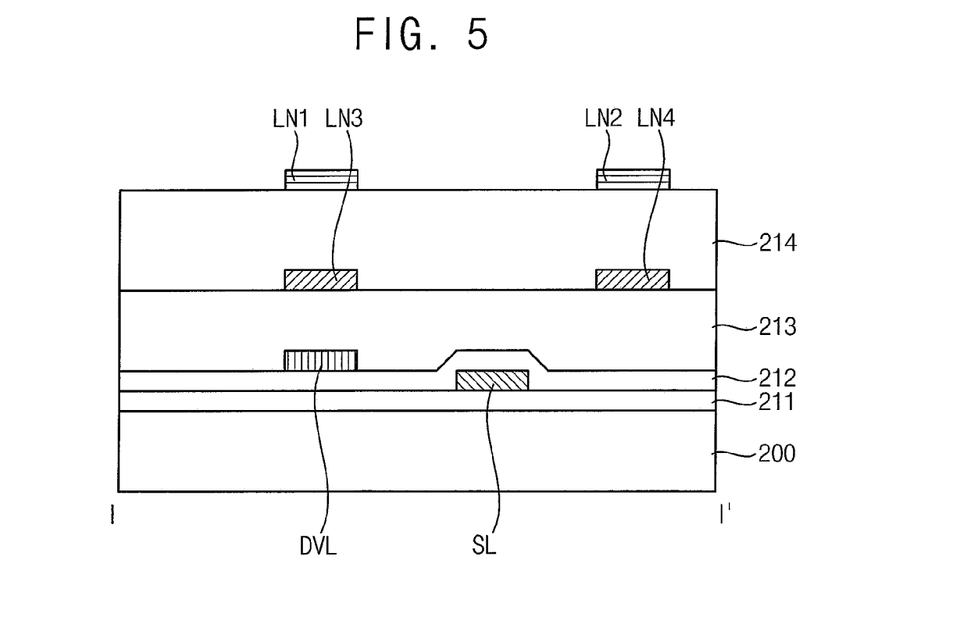
FIG. 5 is a schematic cross sectional view taken along line I-I' of FIG. 4.

FIG. 5 is a schematic cross-sectional view taken along line I-I' of FIG. 4.

Referring to FIGS. 3, 4, and 5, the scan lines SL, the first data lines DL1, the second data lines DL2, and the driving voltage lines DVL that bypass the hole HL may be disposed in the hole edge region HEA on the substrate 200.

In the hole edge region HEA, the first data lines DL1, the second data lines DL2 and at least one of the gate electrode 220, the capacitor electrode 230, the source and drain electrodes 241 and 242, and the connection electrode 250 that are disposed in the display region DA may be disposed on the same layer. In an embodiment, in the hole edge region HEA, the first data lines DL1, the second data lines DL2, and at least one of the source and drain electrodes 241 and 242 and the connection electrode 250 may be disposed on the same layer. For example, in the hole edge region HEA, the first wire LN1, the second wire LN2 and the connection electrode 250 may be disposed on the same layer, and the third wire LN3, the fourth wire LN4, and the source and drain electrodes 241 and 242 may be disposed on the same layer. In other words, in the hole edge region HEA, the first wire LN1 and the second wire LN2 may be disposed on the fourth insulating layer 214, and the third wire LN3 and the fourth wire LN4 may be disposed on the third insulating layer 213. Since the second wire LN2 and the third wire LN3 are disposed on mutually different layers in the hole edge region HEA, the second wire LN2 and the third wire LN3 may be insulated from each other in the region CA where the second wire LN2 intersects the third wire LN3.

Hereinafter, a display device according to an embodiment will be described with reference to FIGS. 6 and 7. In a display device according to an embodiment that will be described with reference to FIGS. 6 and 7, descriptions of components that are substantially identical or similar to the components of the display device according to one embodiment described with reference to FIGS. 4 and 5 will be omitted.

Figure 6:
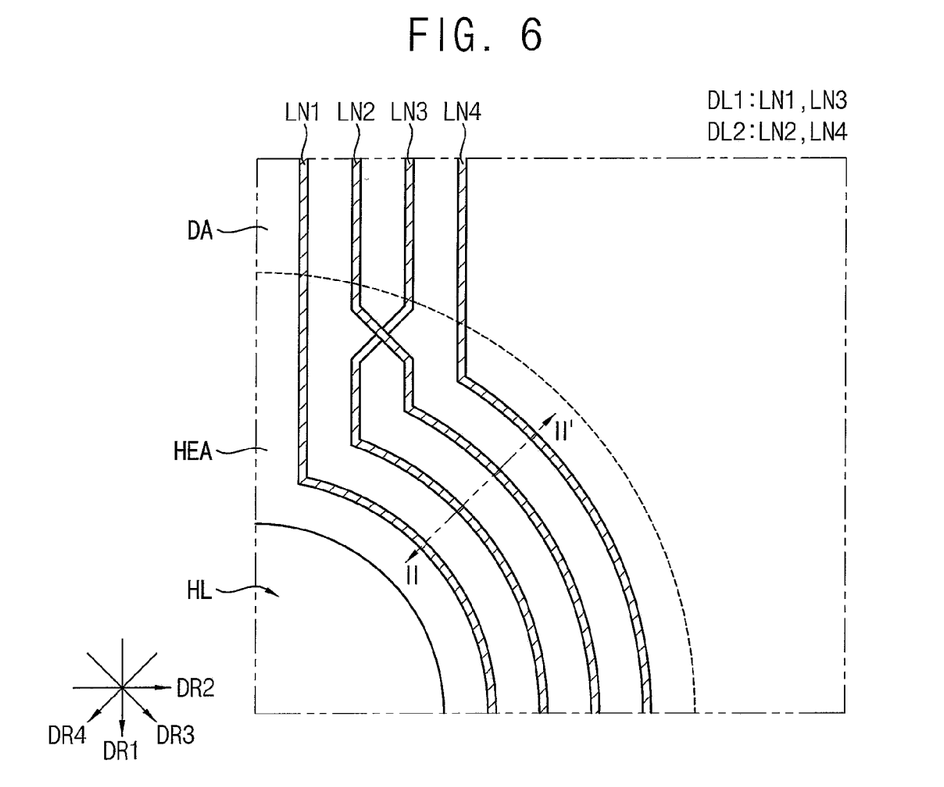
FIG. 6 is a schematic plan view illustrating an example of the periphery of the hole of the display device of FIG. 2.

FIG. 6 is a schematic plan view illustrating an example of the periphery of the hole HL of the display device of FIG. 2. FIG. 6 illustrates the first data lines DL1 and the second data lines DL2 of the display device of FIG. 1. FIG. 7 is a schematic cross-sectional view taken along line II-II' of FIG. 6.

Figure 7:
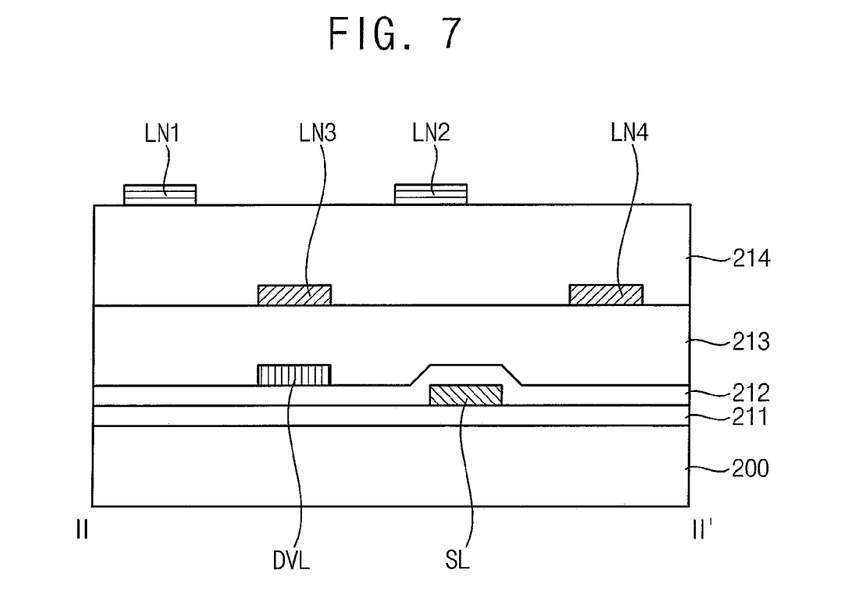
FIG. 7 is a schematic cross sectional view taken along line II-II' of FIG. 6.

Referring to FIGS. 6 and 7, in an embodiment, in the hole edge region HEA, the first data lines DL1 may be adjacent to each other in a plan view, and the second data lines DL2 may be adjacent to each other in a plan view. In other words, the first data lines DL1 may become closer to each other in the hole edge region HEA without overlapping each other in a plan view, and the second data lines DL2 may become closer to each other in the hole edge region HEA without overlapping each other in a plan view. For example, in the hole edge region HEA, the third wire LN3 may be adjacent to the first wire LN1 in a plan view, and the second wire LN2 may be adjacent to the fourth wire LN4 in a plan view. Since the first data lines DL1 are adjacent to each other in a plan view and the second data lines DL2 are adjacent to each other in a plan view in the hole edge region HEA, the coupling between the first data lines DL1 and the second data lines DL2 may be reduced or substantially prevented.

Hereinafter, a display device according to one embodiment will be described with reference to FIGS. 8 and 9. In a display device according to an embodiment that will be described with reference to FIGS. 8 and 9, descriptions of components that are substantially identical or similar to the components of the display device according to an embodiment described with reference to FIGS. 6 and 7 will be omitted.

Figure 8:
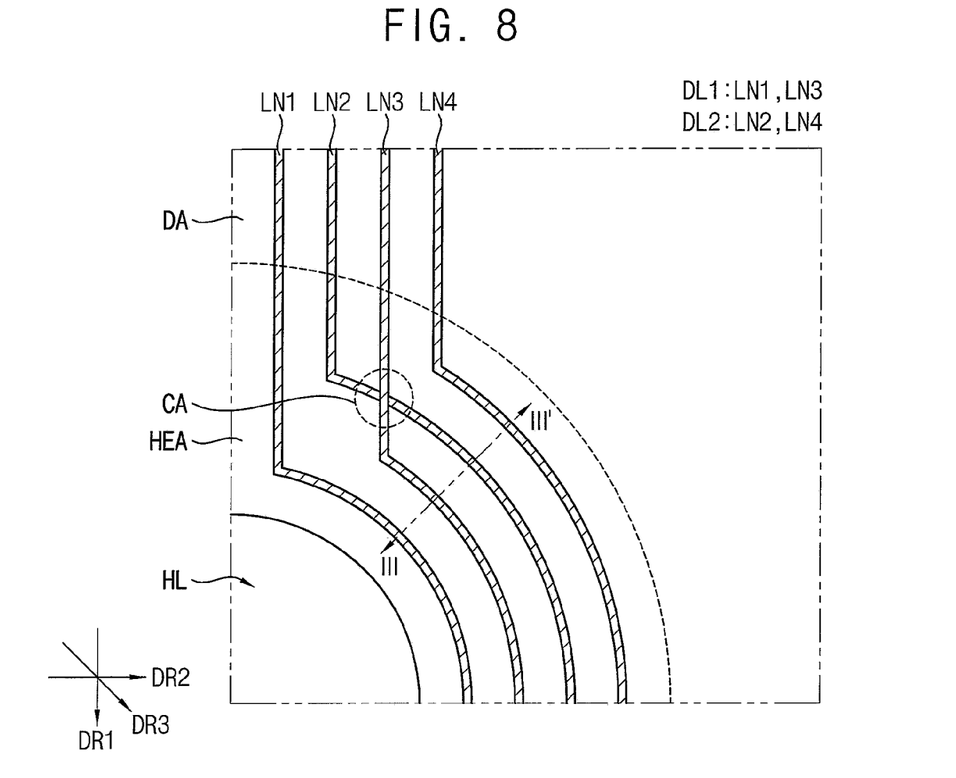
FIG. 8 is a schematic plan view illustrating an example of the periphery of the hole of the display device of FIG. 2.

FIG. 8 is a schematic plan view illustrating an example of the periphery of the hole HL of the display device of FIG. 2. FIG. 8 illustrates the first data lines DL1 and the second data lines DL2 of the display device of FIG. 1.

Referring to FIG. 8, in an embodiment, in the region CA where the second wire LN2 intersects the third wire LN3, the second wire LN2 may extend in the third direction DR3 different from the first direction DR1 and the second direction DR2, and the third wire LN3 may extend in the first direction DR1. For example, the third direction DR3 may form an acute angle with the first direction DR1 in the counterclockwise direction from the first direction DR1. In this case, the second wire LN2 extending in the first direction DR1 in the display region DA may be bent in the third direction DR3 in the region CA where the second wire LN2 intersects the third wire LN3, and the third wire LN3 extending in the first direction DR1 in the display region DA may not be bent in the region CA where the second wire LN2 intersects the third wire LN3.

Figure 9:
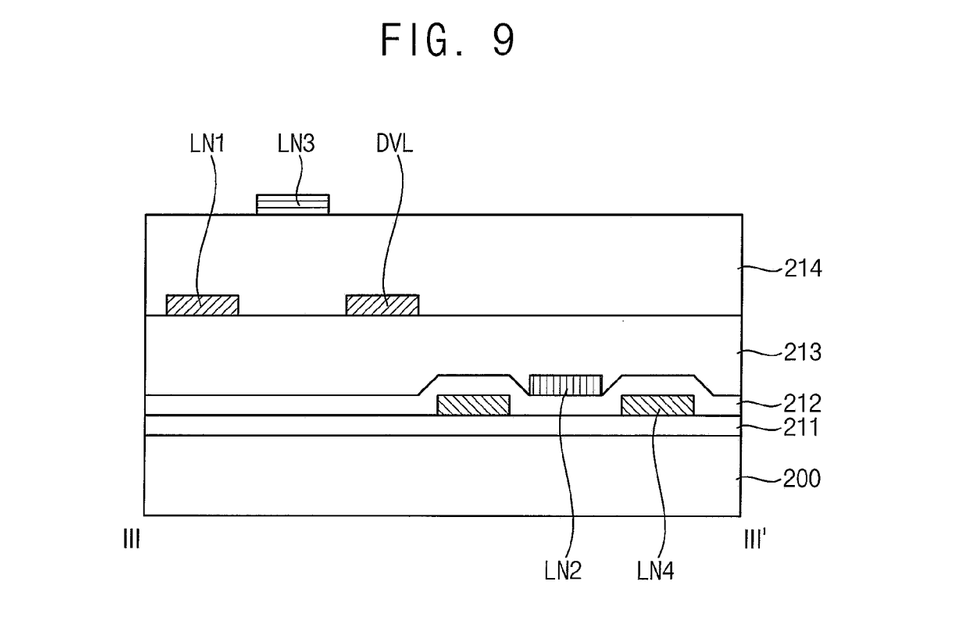
FIG. 9 is a schematic cross sectional view taken along line III-III' of FIG. 8.

FIG. 9 is a schematic cross-sectional view taken along line III-III-40 of FIG. 8.

Referring to FIGS. 3, 8, and 9, in an embodiment, in the hole edge region HEA, the first data lines DL1, the second data lines DL2, and at least one of the gate electrode 220, the capacitor electrode 230, the source and drain electrodes 241 and 242, and the connection electrode 250 may be disposed on the same layer. For example, in the hole edge region HEA, the first wire LN1 and the source and drain electrodes 241 and 242 may be disposed on the same layer, the second wire LN2 and the capacitor electrode 230 may be disposed on the same layer, the third wire LN3 and the connection electrode 250 may be disposed on the same layer, and the fourth wire LN4 and the gate electrode 220 may be disposed on the same layer. In other words, in the hole edge region HEA, the first wire LN1 may be disposed on the third insulating layer 213, the second wire LN2 may be disposed on the second insulating layer 212, the third wire LN3 may be disposed on the fourth insulating layer 214, and the fourth wire LN4 may be disposed on the first insulating layer 211.

Hereinafter, a display device according to an embodiment will be described with reference to FIGS. 10 and 11. In a display device according to an embodiment that will be described with reference to FIGS. 10 and 11, descriptions of components that are substantially identical or similar to the components of the display device according to an embodiment described with reference to FIGS. 8 and 9 will be omitted.

Figure 10:
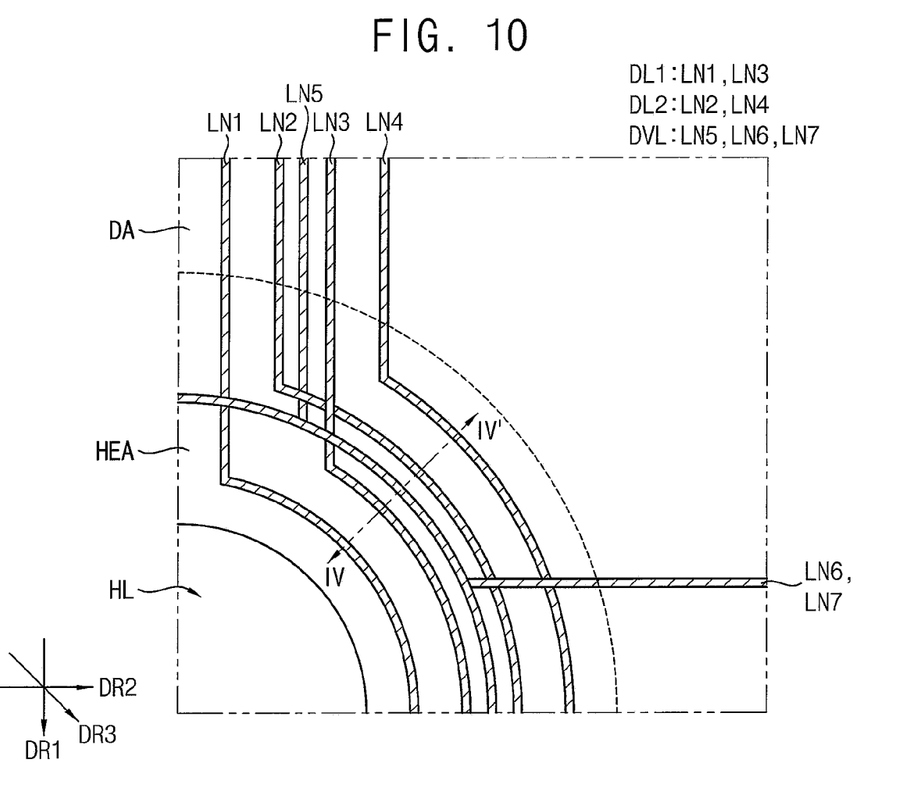
FIG. 10 is a schematic plan view illustrating an example of the periphery of the hole of the display device of FIG. 2.

FIG. 10 is a schematic plan view illustrating an example of the periphery of the hole HL of the display device of FIG. 2. FIG. 10 illustrates the first data lines DL1, the second data lines DL2, and the driving voltage lines DVL of the display device of FIG. 1.

Referring to FIGS. 2 and 10, the first data lines DL1, the second data lines DL2, and the driving voltage lines DVL may be disposed in the display region DA and the hole edge region HEA on the substrate 200.

Some of the driving voltage lines DVL may extend in the first direction DR1 in the display region DA while being arranged in the second direction DR2, and the rest of the driving voltage lines DVL may extend in the second direction DR2 in the display region DA while being arranged in the first direction DR1. The driving voltage lines DVL may bypass the hole HL along the hole edge region HEA.

In an embodiment, the driving voltage lines DVL may include a fifth wire LN5 extending in the first direction DR1 in the display region DA, and a sixth wire LN6 and a seventh wire LN7 extending in the second direction DR2 in the display region DA. In the display region DA, the fifth wire LN5 may be disposed between the second wire LN2 and the third wire LN3 in a plan view.

In an embodiment, in the hole edge region HEA, the driving voltage lines DVL may be disposed between the first data lines DL1 and the second data lines DL2 in a plan view. For example, in the hole edge region HEA, the fifth wire LN5, the sixth wire LN6, and the seventh wire LN7 may overlap each other in a plan view, and the fifth wire LN5, the sixth wire LN6, and the seventh wire LN7 may be disposed between the second wire LN2 and the third wire LN3 in a plan view. Since the driving voltage lines DVL configured to transmit the driving voltage, which may be a direct current voltage, are disposed between the first data lines DL1 and the second data lines DL2 in a plan view, the driving voltage lines DVL may shield between the first data lines DL1 and the second data lines DL2, so that the coupling between the first data lines DL1 and the second data lines DL2 may be further reduced or substantially prevented.

Figure 11:
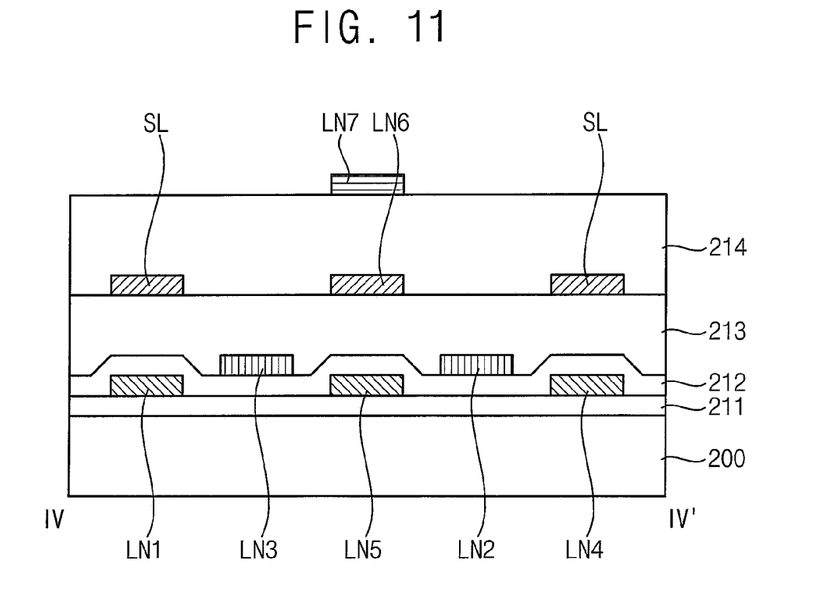
FIG. 11 is a schematic cross sectional view taken along line IV-IV' of FIG. 10.

FIG. 11 is a schematic cross-sectional view taken along line IV-IV' of FIG. 10.

Referring to FIGS. 3, 10, and 11, in an embodiment, in the hole edge region HEA, the first data lines DL1, the second data lines DL2, the driving voltage lines DVL, and at least one of the gate electrode 220, the capacitor electrode 230, the source and drain electrodes 241 and 242, and the connection electrode 250 that are disposed in the display region DA may be disposed on the same layer. In an embodiment, in the hole edge region HEA, the first data lines DL1, the second data lines DL2, and at least one of the gate electrode 220 and the capacitor electrode 230 may be disposed on the same layer, and the driving voltage lines DVL and at least one of the gate electrode 220, the capacitor electrode 230, the source and drain electrodes 241 and 242, and the connection electrode 250 may be disposed on the same layer. For example, in the hole edge region HEA, the first wire LN1, the fourth wire LN4, the fifth wire LN5, and the gate electrode 220 may be disposed on the same layer, the second wire LN2, the third wire LN3, and the capacitor electrode 230 may be disposed on the same layer, the sixth wire LN6 and the source and drain electrodes 241 and 242 may be disposed on the same layer, and the seventh wire LN7 and the connection electrode 250 may be disposed on the same layer. In other words, in the hole edge region HEA, the first wire LN1, the fourth wire LN4, and the fifth wire LN5 may be disposed on the first insulating layer 211, the second wire LN2, and the third wire LN3 may be disposed on the second insulating layer 212, the sixth wire LN6 may be disposed on the third insulating layer 213, and the seventh wire LN7 may be disposed on the fourth insulating layer 214.

Hereinafter, a display device according to an embodiment will be described with reference to FIGS. 12 and 13. In a display device according to an embodiment that will be described with reference to FIGS. 12 and 13, descriptions of components that are substantially identical or similar to the components of the display device according to an embodiment described with reference to FIGS. 10 and 11 will be omitted.

Figure 12:
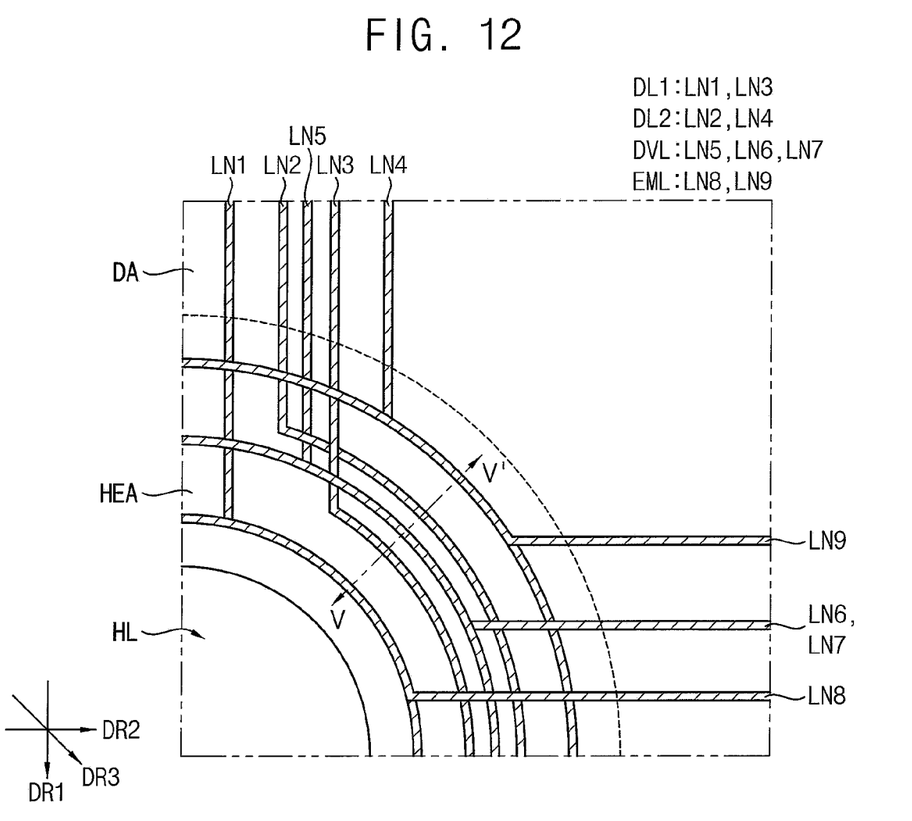
FIG. 12 is a schematic plan view illustrating an example of the periphery of the hole of the display device of FIG. 2.

FIG. 12 is a schematic plan view illustrating an example of the periphery of the hole HL of the display device of FIG. 2. FIG. 12 illustrates the first data lines DL1, the second data lines DL2, the emission control lines EML, and the driving voltage lines DVL of the display device of FIG. 1.

Referring to FIGS. 2 and 12, the first data lines DL1, the second data lines DL2, the emission control lines EML, and the driving voltage lines DVL may be disposed in the display region DA and the hole edge region HEA on the substrate 200.

The emission control lines EML may extend in the second direction DR2 in the display region DA and may be arranged in the first direction DR1. The emission control lines EML may bypass the hole HL along the hole edge region HEA.

In an embodiment, the emission control lines EML may include an eighth wire LN8 and a ninth wire LN9 arranged in the first direction DR1 in the display region DA.

In an embodiment, in the hole edge region HEA, the emission control lines EML may overlap the first data lines DL1 and the second data lines DL2 in a plan view. For example, in the hole edge region HEA, the eighth wire LN8 may overlap the first wire LN1 in a plan view, and the ninth wire LN9 may overlap the fourth wire LN4 in a plan view.

Figure 13:
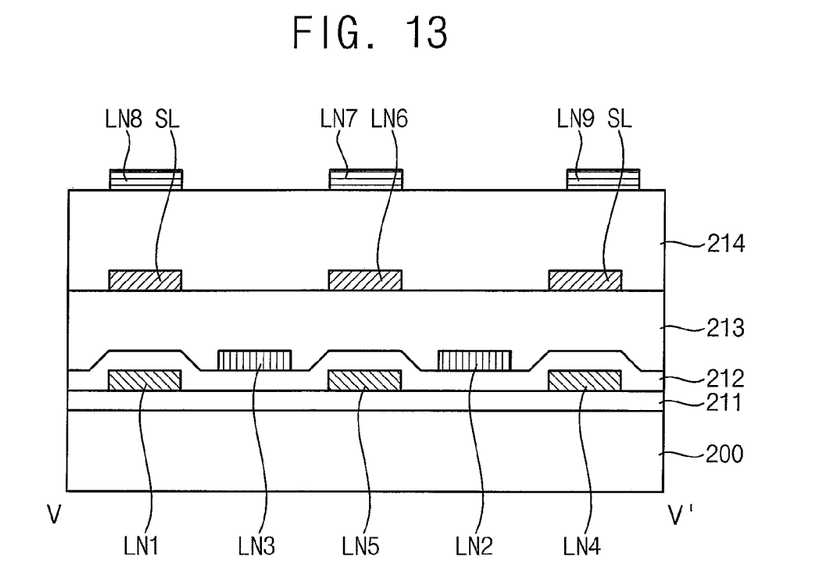
FIG. 13 is a schematic cross sectional view taken along line V-V' of FIG. 12.

FIG. 13 is a schematic cross-sectional view taken along line V-V' of FIG. 12.

Referring to FIGS. 3, 12, and 13, in an embodiment, in the hole edge region HEA, the first data lines DL1, the second data lines DL2, and at least one of the gate electrode 220 and the capacitor electrode 230 may be disposed on the same layer, and the emission control lines EML and the connection electrode 250 may be disposed on the same layer. For example, in the hole edge region HEA, the first wire LN1, the fourth wire LN4, and the gate electrode 220 may be disposed on the same layer, the second wire LN2, the third wire LN3, and the capacitor electrode 230 may be disposed on the same layer, and the eighth wire LN8, the ninth wire LN9, and the connection electrode 250 may be disposed on the same layer. In other words, in the hole edge region HEA, the first wire LN1 and the fourth wire LN4 may be disposed on the first insulating layer 211, the second wire LN2 and the third wire LN3 may be disposed on the second insulating layer 212, and the eighth wire LN8 and the ninth wire LN9 may be disposed on the fourth insulating layer 214.

Since the area of the hole edge region HEA is relatively small, in case that the interval or distance between the first and second data lines DL1 and DL2 and the emission control lines EML decreases in the hole edge region HEA, coupling between the first and second data lines DL1 and DL2 and the emission control lines EML may occur. In case that the coupling between the first and second data lines DL1 and DL2 and the emission control lines EML occurs, the data signal transmitted through the first and second data lines DL1 and DL2 may be distorted by a change in the emission control signal transmitted through the emission control lines EML.

However, in an embodiment, since the first data lines DL1, the second data lines DL2, and at least one of the gate electrode 220 and the capacitor electrode 230 are disposed on the same layer, and the emission control lines EML and the connection electrode 250 are disposed on the same layer in the hole edge region HEA, and since the thickness of the fourth insulating layer 214 disposed between the first and second data lines DL1 and DL2 and the emission control lines EML is relatively large, the interval between the first and second data lines DL1 and DL2 and the emission control lines EML in a vertical direction may be increased. Accordingly, the coupling between the first and second data lines DL1 and DL2 and the emission control lines EML may be reduced or substantially prevented.

Figure 14:
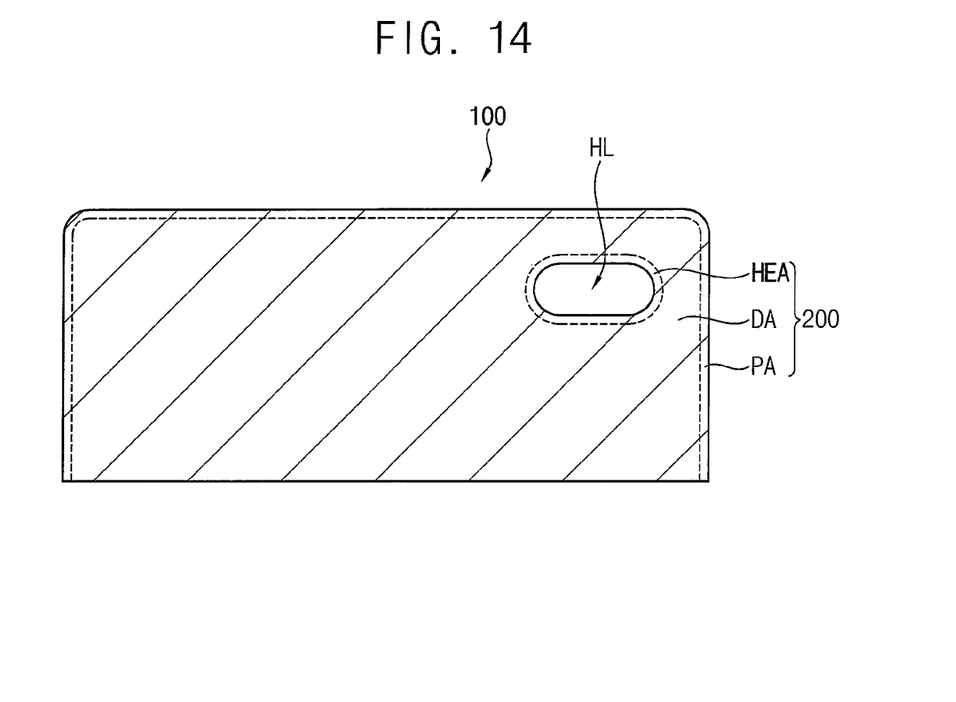
FIG. 14 is a schematic plan view illustrating a part of a display device according to an embodiment.

FIG. 14 is a schematic plan view illustrating a part of a display device according to an embodiment.

Referring to FIG. 14, a substrate 200 of a display device according to an embodiment may include a display region DA, a peripheral region PA, and a hole edge region HEA. The display device that will be described with reference to FIG. 14 may be substantially identical or similar to the display device described with reference to FIG. 2 except for the shape of the hole HL. Therefore, redundant descriptions thereof will be omitted.

In an embodiment, the hole HL may have a rectangular shape with rounded corners in a plan view, and the hole edge region HEA may have a rectangular ring shape with rounded corners in a plan view.

Figure 15:
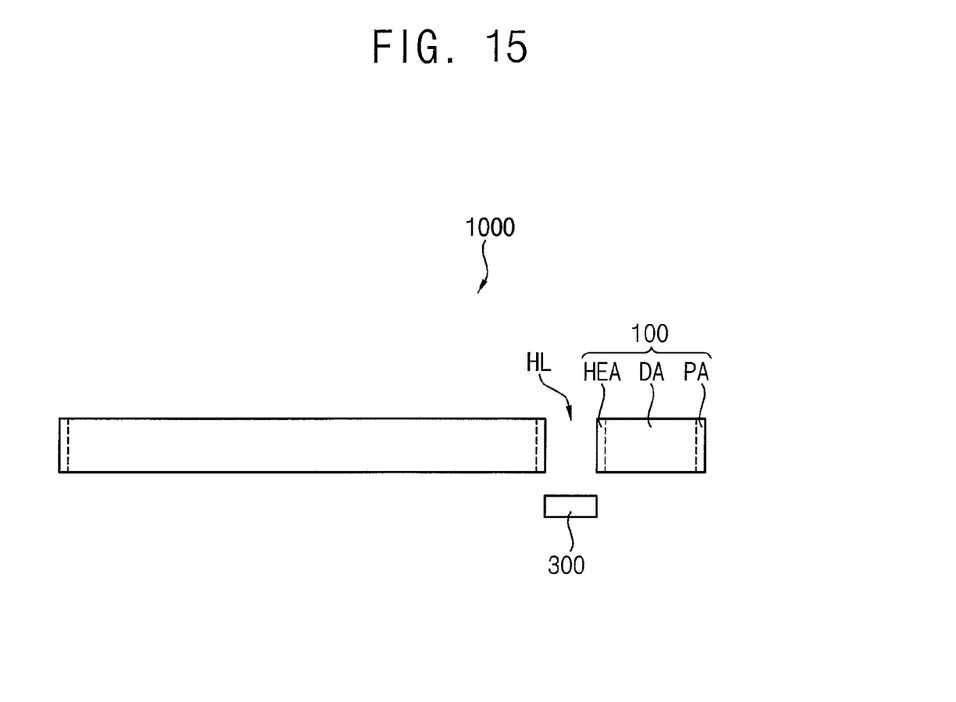
FIG. 15 is a schematic cross sectional view illustrating an electronic device according to an embodiment.

FIG. 15 is a schematic cross-sectional view illustrating an electronic device according to an embodiment.

Referring to FIG. 15, according to an embodiment, an electronic device 1000 may include a display device 100 and a functional module 300. The display device 100 may include a display region DA, a peripheral region PA, and a hole edge region HEA. The display device 100 of FIG. 15 may be substantially identical to the display device 100 described with reference to FIGS. 1 to 14.

The functional module 300 may be disposed under the display device 100. The functional module 300 may be disposed under the display device 100 to overlap the hole HL.

In an embodiment, the functional module 300 may include a camera module for capturing (or recognizing) an image of an object that is located over a front surface of the display device 100; a face recognition sensor module for detecting a face of a user; a pupil recognition sensor module for detecting a pupil of the user; an acceleration sensor module and a geomagnetic sensor module for determining a movement of the display device; a proximity sensor module and an infrared sensor module for detecting proximity with respect to the front surface of the display device; and an illuminance sensor module for measuring a degree of brightness of an outside.

The display device according to the embodiments may be applied to a display device included in a computer, a laptop, a mobile phone, a smartphone, a smart pad, a PMP, a PDA, an MP3 player, or the like.

Although the display devices and the electronic devices according to some embodiments have been described with reference to the drawings, the illustrated embodiments are examples, and may be modified and changed by a person having ordinary knowledge in the relevant technical field without departing from the technical spirit described in the disclosure.

What is claimed is:

1. A display device comprising:
 a substrate including a display region, a hole, and a hole edge region surrounding the hole;
 first pixels displaying a first color and second pixels displaying a second color different from the first color, the first and second pixels disposed on the substrate;
 a plurality of first data lines electrically connected to the first pixels, disposed on the substrate, extending in a first direction, arranged in a second direction intersecting the first direction in the display region, and bypassing the hole along the hole edge region;

a plurality of second data lines electrically connected to the second pixels, disposed on the substrate, extending in the first direction, alternately arranged with the plurality of first data lines in the second direction in the display region, and bypassing the hole along the hole edge region; and a driving voltage line electrically connected to a power supply voltage, wherein at least one of the plurality of first data lines intersects at least one of the plurality of second data lines such that the plurality of first data lines are adjacent to each other and spaced apart from each other and the plurality of second data lines are adjacent to each other and spaced apart from each other in the hole edge region in a plan view, and the driving voltage line is disposed between one of the plurality of first data lines and one of the plurality of second data lines in the hole edge region on a same plane.

2. The display device of claim 1, wherein, in the hole edge region, the plurality of first data lines overlap each other in a plan view, and the plurality of second data lines overlap each other in a plan view.

3. The display device of claim 1, wherein each of the plurality of first data lines and the plurality of second data lines include two data lines, and a first data line disposed between the plurality of second data lines among the plurality of first data lines intersects a second data line disposed between the plurality of first data lines among the plurality of second data lines.

4. The display device of claim 3, wherein, in a region where the first data line intersects the second data line, the second data line extends in a third direction different from the first direction and the second direction, and the first data line extends in a fourth direction intersecting the third direction.

5. The display device of claim 3, wherein, in a region where the first data line intersects the second data line, the second data line extends in a third direction different from the first direction and the second direction, and the first data line extends in the first direction.

6. The display device of claim 1, further comprising:

a semiconductor layer disposed in the display region on the substrate;

a gate electrode disposed over the semiconductor layer;

a capacitor electrode disposed over the gate electrode;

a source electrode and a drain electrode disposed over the capacitor electrode and electrically connected to the semiconductor layer;

a connection electrode disposed over the source electrode and the drain electrode and electrically connected to the source electrode and the drain electrode; and a light emitting element disposed over the connection electrode and electrically connected to the connection electrode.

7. The display device of claim 6, wherein, in the hole edge region, the plurality of first data lines, the plurality of second data lines, and at least one of the gate electrode, the capacitor electrode, the source electrode and the drain electrode, and the connection electrode are disposed on a same layer.

8. The display device of claim 6, further comprising an emission control line disposed on the substrate, extending in the second direction in the display region, and bypassing the hole along the hole edge region.

9. The display device of claim 8, wherein the plurality of first data lines, the plurality of second data lines, and at least one of the gate electrode and the capacitor electrode are disposed on a same layer in the hole edge region, and the emission control line and the connection electrode in the hole edge region are disposed on a same layer.

10. The display device of claim 1, wherein the hole has a circular shape, and the hole edge region has a circular ring shape.

11. A display device comprising:

a substrate including a display region, a hole, and a hole edge region surrounding the hole;

first pixels displaying a first color and second pixels displaying a second color different from the first color, the first and second pixels, the first and second pixels disposed on the substrate; and a first wire, a second wire, a third wire, and a fourth wire each disposed on the substrate, extending in a first direction, arranged in a second direction intersecting the first direction in the display region, and bypassing the hole along the hole edge region; and a driving voltage line electrically connected to a power supply voltage, wherein the first wire and the third wire are electrically connected to the first pixels, the second wire and the fourth wire are electrically connected to the second pixels, the second wire intersects the third wire such that the first and third wires are adjacent to each other and spaced apart from each other and the second and fourth wires are adjacent to each other and spaced apart from each other in the hole edge region in a plan view, and the driving voltage line is disposed between the third wire and the second wire in the hole edge region on a same plane.

12. The display device of claim 11, wherein, in the hole edge region, the first and third wires overlap each other in a plan view, and the second and fourth wires overlap each other in a plan view.

13. The display device of claim 11, wherein, in a region where the second wire intersects the third wire, the second wire extends in a third direction different from the first direction and the second direction, and the third wire extends in a fourth direction intersecting the third direction.

14. The display device of claim 13, wherein the first direction is orthogonal to the second direction, and the fourth direction is orthogonal to the third direction.

15. The display device of claim 11, wherein, in a region where the second wire intersects the third wire, the second wire extends in a third direction different from the first direction and the second direction, and the third wire extends in the first direction.

16. The display device of claim 11, wherein the first and third wires are electrically connected to first pixels disposed in the display region on the substrate, and the second and fourth wires are electrically connected to second pixels disposed in the display region on the substrate to display a color different from a color of the first pixels.

17. An electronic device comprising:
a display device including a display region, a hole, and a hole edge region surrounding the hole; and
a functional module disposed under the display device and overlapping the hole, wherein
the display device includes:
- first pixels displaying a first color and second pixels displaying a second color different from the first color;
- a plurality of first data lines electrically connected to the first pixels, extending in a first direction, arranged in a second direction intersecting the first direction in the display region, and bypassing the hole along the hole edge region; and
- a plurality of second data lines electrically connected to the second pixels, extending in the first direction, alternately arranged with the plurality of first data lines in the second direction in the display region, and bypassing the hole along the hole edge region; and
- a driving voltage line electrically connected to a power supply voltage,
- at least one of the plurality of first data lines intersects at least one of the plurality of second data lines such that the plurality of first data lines are adjacent to each other and spaced apart from each other and the plurality of second data lines are adjacent to each other and spaced apart from each other in the hole edge region in a plan view, and
- the driving voltage line is disposed between one of the plurality of first data lines and one of the plurality of second data lines in the hole edge region on a same plane.

18. The electronic device of claim 17, wherein the functional module includes at least one of a camera module, a face recognition sensor module, a pupil recognition sensor module, an acceleration sensor module, a proximity sensor module, an infrared sensor module, and an illuminance sensor module.

* * * * *